United States Patent
Chen

(10) Patent No.: US 10,504,450 B2
(45) Date of Patent: Dec. 10, 2019

(54) MICRO LIGHT-EMITTING DIODE ARRAY SUBSTRATE AND DISPLAY PANEL

(71) Applicant: Shenzhen China Star Optoelectronics Technology Co., Ltd., Shenzhen, Guangdong (CN)

(72) Inventor: Lixuan Chen, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 329 days.

(21) Appl. No.: 15/521,658

(22) PCT Filed: Mar. 14, 2017

(86) PCT No.: PCT/CN2017/076568
§ 371 (c)(1),
(2) Date: Apr. 25, 2017

(87) PCT Pub. No.: WO2018/152887
PCT Pub. Date: Aug. 30, 2018

(65) Prior Publication Data
US 2018/0336839 A1 Nov. 22, 2018

(30) Foreign Application Priority Data
Feb. 27, 2017 (CN) .......................... 2017 1 0106472

(51) Int. Cl.
*G09G 3/34* (2006.01)
*H01L 33/00* (2010.01)

(52) U.S. Cl.
CPC ............... *G09G 3/34* (2013.01); *H01L 33/00* (2013.01)

(58) Field of Classification Search
CPC ....... H01L 33/00; H01L 29/45; H01L 27/156; H01L 2224/73253; H01L 33/641;
(Continued)

(56) References Cited

U.S. PATENT DOCUMENTS

2016/0260835 A1* 9/2016 Yamazaki ........... H01L 29/7869
2017/0018688 A1* 1/2017 Mazed .................. H01L 33/502

FOREIGN PATENT DOCUMENTS

CN 1402880 A 3/2003
CN 103066195 A 4/2013
(Continued)

*Primary Examiner* — Charles V Hicks
(74) *Attorney, Agent, or Firm* — Andrew C. Cheng

(57) ABSTRACT

The disclosure provides a micro light-emitting diode array substrate, including a glass substrate. The glass substrate is formed with a gate electrode and a dielectric layer in sequence. The dielectric layer is formed with a semiconductor layer and a pixel electrode. The semiconductor layer is disposed with a source electrode and a drain electrode. The drain electrode and the adjacent pixel electrode are connected. The pixel electrode is connected with a micro light-emitting diode. The gate electrode, the source electrode, the drain electrode, the pixel electrode and a lead connected with a pin of the micro light-emitting diode are all made out of graphene conductive material. The disclosure further provides a display panel, including the micro LED array substrate. Micro LEDs are respectively disposed with color block layers. Compared with the prior art, heat of the micro light-emitting diodes can be transmitted to other regions for improving heat dissipation.

8 Claims, 2 Drawing Sheets

(58) Field of Classification Search
CPC ......... H01L 33/647; H01L 2224/16225; H01L 33/62; G09G 3/34
See application file for complete search history.

(56) References Cited

FOREIGN PATENT DOCUMENTS

| | | |
|---|---|---|
| CN | 103904108 A | 7/2014 |
| CN | 105629576 A | 6/2016 |
| CN | 105702697 A | 6/2016 |
| CN | 105720175 A | 6/2016 |
| CN | 105914200 A | 8/2016 |
| CN | 105976725 A | 9/2016 |
| CN | 106098697 A | 11/2016 |
| CN | 106098720 A | 11/2016 |
| CN | WO2016200882 A1 | 12/2016 |
| CN | 106356386 A | 1/2017 |
| TW | 201438218 A | 10/2014 |
| TW | 201448289 A | 12/2014 |

* cited by examiner

MICRO LIGHT-EMITTING DIODE ARRAY SUBSTRATE AND DISPLAY PANEL

TECHNICAL FIELD

The disclosure relates to a micro light-emitting diode display technical field, and more particularly to a micro light-emitting diode array substrate and a display panel.

DESCRIPTION OF RELATED ART

Panel display devices are widely applied in various consumer electronics such as mobile phones, televisions, personal digital assistants, digital cameras, laptops and computers due to virtues such as high quality, energy saving, a thin body and wide application, which have been the mainstream in the display devices.

A micro LED (μLED) display is a display using LED arrays with the high density and mini size integrated on a substrate as display pixels to display images. Identically to an outdoor LED screen with a large size, each pixel can address as well as being driven to be lit independently, which can be considered as a smaller version of the outdoor LED screen that reduces distances among pixels from a millimeter scale to a micron scale. The μLED display and the organic light-emitting diode (OLED) display are both self-luminous displays, but the μLED display has advantages such as more stable material, longer life without image brand compared with the OLED display, which is regarded as a major competitor of the OLED display.

A conventional micro LED display array is a micro LED array structure designed above a driving array. Communicating connection of the array will be drove by positive and negative electrodes. Switch state and brightness of micro LEDs of each pixel are controlled by a TFT array. The density of the micro LEDs will be extremely high during high pixels per inch (PPI) display due to the micro size of the micro LED array, which has a problem of poor heat dissipation. The heat dissipation problem of the micro LED array substrate will influence the display effect on the display region, including variation of the voltage and current according to the temperature, service life reduction of the chip and thermal quenching of the micro LED. When a color block layer is made out of quantum dot (QD) material, the high temperature problem of the micro LED array can easily affect stability of the QD material due to poor thermal resistance of the material.

SUMMARY

In order to overcome shortcomings of the prior art, the disclosure provides a micro light-emitting diode array substrate and a display panel to enhance heat dissipation.

The disclosure provides a micro light-emitting diode array substrate, including a glass substrate. The glass substrate is formed with a gate electrode and a dielectric layer in sequence. The dielectric layer is formed with a semiconductor layer and a pixel electrode. The semiconductor layer is disposed with a source electrode and a drain electrode. The drain electrode and the adjacent pixel electrode are connected. The pixel electrode is connected with a micro light-emitting diode. The gate electrode, the source electrode, the drain electrode, the pixel electrode and a lead connected with a pin of the micro light-emitting diode are all made out of graphene conductive material.

In an embodiment of the disclosure, a surface of the micro light-emitting diode is covered by a heat dissipation layer.

In an embodiment of the disclosure, the heat dissipation layer is made out of graphene.

The disclosure further provides a display panel, including the micro light-emitting diode array substrate. The micro light-emitting diodes are disposed with color block layers respectively.

In an embodiment of the disclosure, heat dissipation layers are disposed between the micro light-emitting diodes and the color block layers.

In an embodiment of the disclosure, the heat dissipation layers are made out of graphene.

In an embodiment of the disclosure, the micro light-emitting diodes are blue micro light-emitting diodes. The color block layers include an R color block layer and a G color block layer. The R color block layer and the G color block layer are respectively disposed above the micro light-emitting diodes used as an R subpixel and a G subpixel.

In an embodiment of the disclosure, the color block layers are made out of quantum dot material.

In an embodiment of the disclosure, the heat dissipation layers on the R color block layer are mutually connected to form an entirety. The heat dissipation layers on the G color block layer are mutually connected to form an entirety.

Compared with the prior art, first, the gate electrode, the source electrode, the drain electrode, the pixel electrode and the lead connected with the pin of the micro light-emitting diodes are all made out of graphene conductive material, so that heat of the micro light-emitting diodes can be transmitted to other regions for improving heat dissipation. Second, the heat dissipation layers disposed between the color block layers on the micro light-emitting diodes and the micro light-emitting diodes can further enhance the heat dissipation.

DETAILED DESCRIPTION OF PREFERRED EMBODIMENTS

The disclosure will be described in detail with reference to embodiments and the accompanying drawings as follows.

Figure 1:
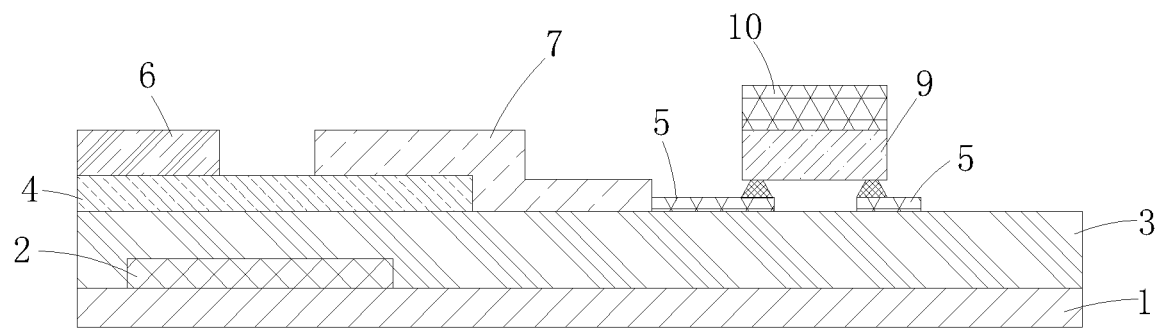
FIG. 1 is a structural schematic view of a first micro light-emitting diode array substrate according to the disclosure.

As shown in FIG. 1, a first micro light-emitting diode array substrate of the disclosure includes a glass substrate 1. The glass substrate 1 is formed with a gate electrode 2 and a dielectric layer 3 in sequence by the conventional technology. The dielectric layer 3 is formed with a semiconductor layer 4 and a pixel electrode 5. The semiconductor layer 4 is disposed with a source electrode 6 and a drain electrode 7. The drain electrode 7 and the adjacent pixel electrode 5 are connected. The pixel electrode 5 is connected with a micro light-emitting diode 9 by transfer printing. The gate electrode 2, the source electrode 6, the drain electrode 7, the pixel electrode 5 and a lead connected with a pin of the micro light-emitting diode 9 are all made out of graphene conductive material.

The electrode wire and the lead adopt the graphene conductive material to solve the problem of heat dissipation. Heat of the micro LED 9, the electrode wire and the lead can be transferred.

A display panel of the disclosure includes the first micro LED array substrate above. The micro LEDs 9 are respectively disposed with color block layers 10. The color block layers 10 include a red (R) color block layer 11, a green (G) color block layer 12, and a blue (B) color block layer 13 to form a pixel.

Figure 2:
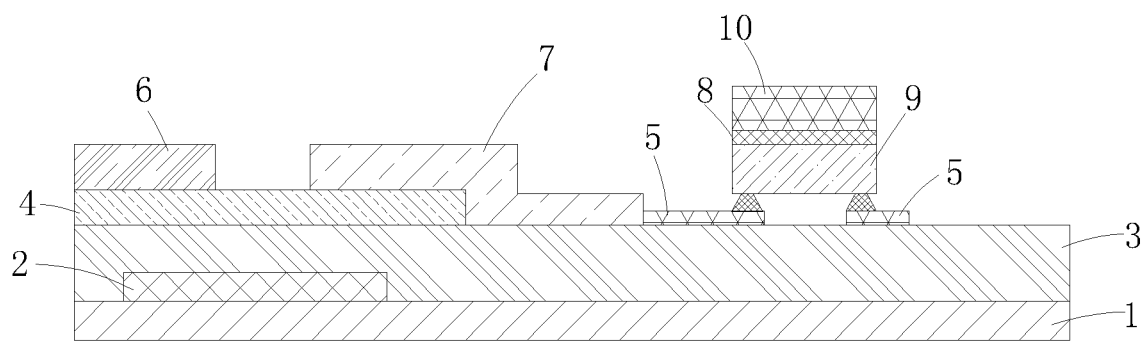
FIG. 2 is a structural schematic view of a second micro light-emitting diode array substrate according to the disclosure.

As shown in FIG. 2, a second micro light-emitting diode array substrate includes the glass substrate 1. The glass substrate 1 is formed with the gate electrode 2 and the dielectric layer 3 in sequence by the conventional technology. The dielectric layer 3 is formed with the semiconductor layer 4 and the pixel electrode 5. The semiconductor layer 4 is disposed with the source electrode 6 and the drain electrode 7. The drain electrode 7 and the adjacent pixel electrode 5 are connected. The pixel electrode 5 is connected with the micro light-emitting diode 9 by transfer printing. The gate electrode 2, the source electrode 6, the drain electrode 7, the pixel electrode 5 and a lead connected with a pin of the micro light-emitting diode 9 are all made out of graphene conductive material. The micro LED 9 is covered by a heat dissipation layer 8. The heat dissipation layer 8 is made out of graphene, which can further improve heat dissipation.

Figure 3:
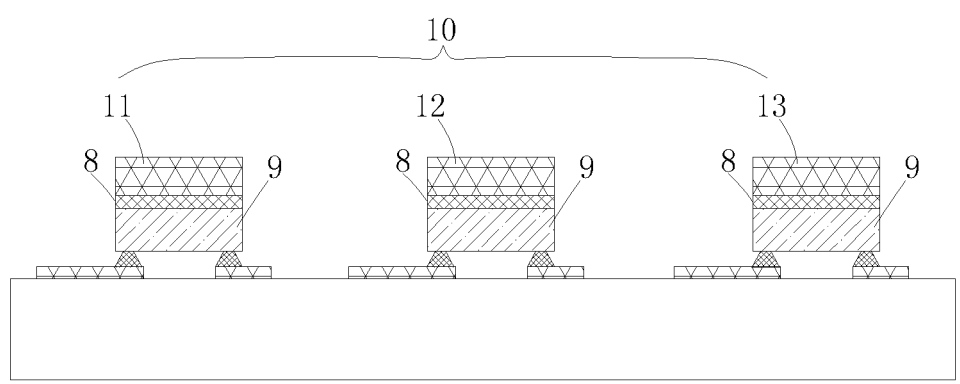
FIG. 3 is a structural schematic view of a display panel according to the disclosure.

As shown in FIG. 3, as a second display panel of the disclosure, except the LEDs 9, the heat dissipation layers 8 and the color block layers 10, other components are identical to the counterparts in FIG. 1 or FIG. 2, which will not be repeated. The heat dissipation layers 8 adopting the second micro LED array substrate are respectively disposed with the color block layers 10. The color block layers 10 include the red (R) color block layer 11, the green (G) color block layer 12, and the blue (B) color block layer 13 to form a pixel. The color block layers 10 are all made out of quantum dot (QD) material. The QD can be called nanocrystal as well, which is a kind of nano particles composed by elements in the II-VI family or III-V family. The diameter of the QD is generally 1-10 nm.

As the material of the color block layers 10 cannot resist the high temperature, the heat dissipation layers 8 made out of graphene are disposed between the color block layers 10 and the micro LEDs 9, which can reduce the heat transferred to the color block layers 10, further preventing influence on the stability of the QD material due to poor heat dissipation. The color block layers 10 can further be replaced by the QD material as a color enhancement layer.

Figure 4:
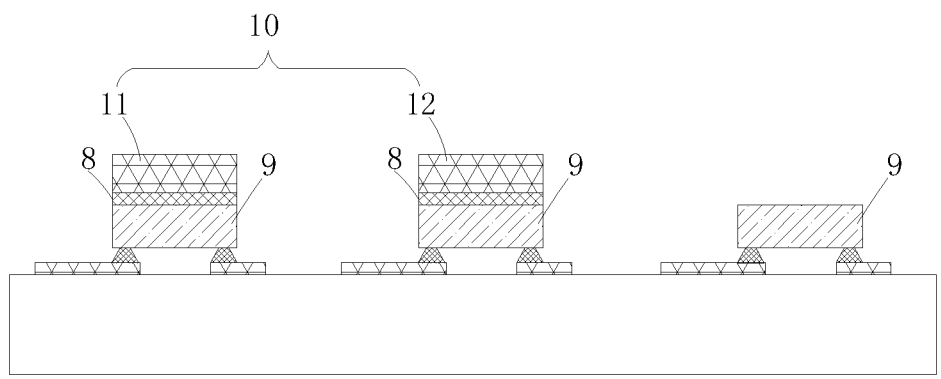
FIG. 4 is a structural schematic view of another display panel according to the disclosure.

As shown in FIG. 4, as a third display panel of the disclosure, the figure merely shows the LEDs 9, the heat dissipation layers 8, and the color block layers 10. The other components are not showed, structures of which are identical to the counterparts in FIG. 1. Therefore, only the improved components will be illustrated. As the third display panel of the disclosure, based on employing the second micro LED array substrate, when the micro LEDs 9 are blue micro LEDs, the color block layers 10 are disposed above the micro LEDs 9 used as an R subpixel and a G subpixel. The color block layers 10 include the R color block layer 11 and the G color block layer 12. As the micro LEDs 9 are the blue micro LEDs, no color block layer is required to be disposed above the micro LED 9 used as the B subpixel, which saves the material. The heat dissipation layers 8 are respectively disposed between the R color block layer 11 and the corresponding micro LED 9, and between the G color block layer 12 and the corresponding micro LED 9. The heat dissipation layers 8 are made out of graphene. The color block layers 10 are made out of the QD material. The color block layers 10 are gray.

Obviously, the color of the micro LED in the third display panel is just an example, which is not a limitation. Any conventional color applied in the micro LED can be regarded as a part of the disclosure. For instance, when the micro LED is red, the corresponding micro LED used as the R subpixel is disposed without the color block layer. The B color block layer is disposed on the micro LED used as the B subpixel. The G color block layer is disposed on the micro LED used as the G subpixel. The disposition of adopting the green micro LED is similar, which will not be repeated.

Figure 5:
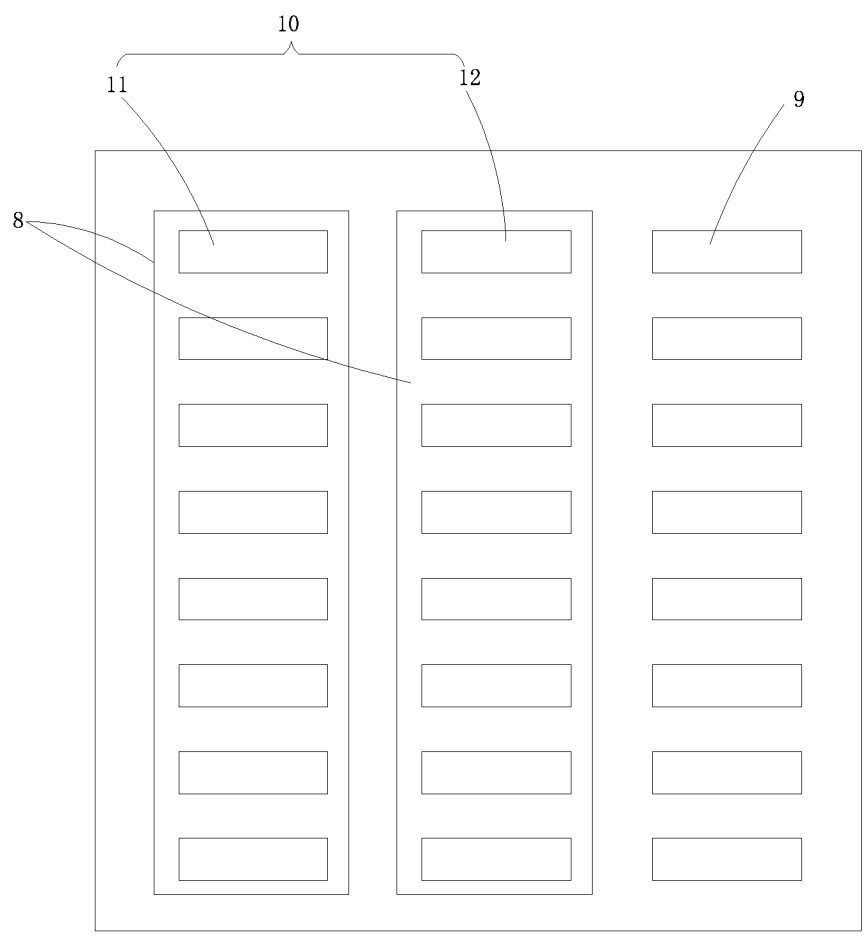
FIG. 5 is a projection diagram of FIG. 4.

As shown in FIG. 5, the heat dissipation layers 8 on the R color block layer 11 are mutually connected to form an entirety to extend the area of the specific heat dissipation layers 8, which improve the heat dissipation effect. The heat dissipation layers 8 on the G color block layer 12 are mutually connected to form an entirety to extend the area of the specific heat dissipation layers 8, which improve the heat dissipation effect.

The color block layers 10 and the heat dissipation layers 8 in the disclosure can be physical contact, which are overlapped mutually, or without contact, the heat dissipation layers are disposed to prevent the high temperature of the micro LEDs from affecting the property of the upper color block layers. The color block layers 10 adopt gray graphene.

The display panel of the disclosure abandons the conventional CF substrate, and prints the color block layers on the micro LEDs by printing directly. A complex process of producing the CF substrate is unnecessary, which saves the material and reduces costs.

Although the disclosure is illustrated with reference to specific embodiments, a person skilled in the art should understand that various modifications on forms and details can be achieved within the spirit and scope of the disclosure limited by the claims and the counterpart.

What is claimed is:

1. A micro light-emitting diode array substrate, comprising an array of micro light-emitting diodes arranged on a glass substrate, the glass substrate formed with a gate electrode and a dielectric layer in sequence, the dielectric layer formed with a semiconductor layer and a pixel electrode, the semiconductor layer disposed with a source electrode and a drain electrode, the drain electrode and the pixel electrode being connected with each other, the pixel electrode being connected with a respective one of the micro light-emitting diodes, wherein the gate electrode, the source electrode, the drain electrode, the pixel electrode and a pin of the micro light-emitting diode are connected through leads made of a graphene conductive material;

wherein each of the micro light-emitting diodes comprises a color block layer arranged on a surface of the micro light-emitting diode to cover the surface of the micro light-emitting diode and a heat dissipation layer made of graphene is arranged between the surface of the micro light-emitting diode and the color block layer.

2. A display panel, comprising a micro light-emitting diode array substrate, the micro light-emitting diode array substrate comprising an array of micro light-emitting diodes arranged on a glass substrate, the glass substrate formed with a gate electrode and a dielectric layer in sequence, the dielectric layer formed with a semiconductor layer and a pixel electrode, the semiconductor layer disposed with a source electrode and a drain electrode, the drain electrode and the pixel electrode being connected with each other, the pixel electrode being connected with a respective one of the micro light-emitting diodes, wherein the gate electrode, the source electrode, the drain electrode, the pixel electrode and a pin of the micro light-emitting diode are connected through leads made of a graphene conductive material, wherein each of the micro light-emitting diodes comprises a color block layer arranged on a surface of the micro light-emitting diode to cover the surface of the micro light-emitting diode and a heat dissipation layer made of graphene is arranged between the surface of the micro light-emitting diode and the color block layer.

3. The display panel according to claim 2, wherein the micro light-emitting diodes are blue micro light-emitting diodes, and the color block layers comprise a red color block layer and a green color block layer, the red color block layer and the green color block layer being respectively disposed above the micro light-emitting diodes to form a red subpixel and a green subpixel.

4. The display panel according to claim 2, wherein the color block layers are each made of a material containing quantum dots.

5. The display panel according to claim 2, wherein the color block layers comprise multiple red color block layers respectively arranged on multiple ones of the micro light-emitting diodes and multiple green color block layers respectively arranged on multiple ones of the micro light-emitting diodes, wherein the heat dissipation layers arranged between the red color block layers and the micro light-emitting diodes are connected to each other to form a unitary combined layer; and the heat dissipation layers arranged between the green color block layers and the micro light-emitting diodes are connected to each other to form a unitary combined layer.

6. The display panel according to claim 4, wherein the color block layers comprise multiple red color block layers respectively arranged on multiple ones of the micro light-emitting diodes and multiple green color block layers respectively arranged on multiple ones of the micro light-emitting diodes, wherein the heat dissipation layers arranged between the red color block layers and the micro light-emitting diodes are connected to each other to form a unitary combined layer; and the heat dissipation layers arranged between the green color block layers and the micro light-emitting diodes are connected to each other to form a unitary combined layer.

7. The micro light-emitting diode array substrate according to claim 1, wherein the color block layers are each made of a material containing quantum dots.

8. The micro light-emitting diode array substrate according to claim 7, wherein the color block layers comprise multiple red color block layers respectively arranged on multiple ones of the micro light-emitting diodes and multiple green color block layers respectively arranged on multiple ones of the micro light-emitting diodes, wherein the heat dissipation layers arranged between the red color block layers and the micro light-emitting diodes are connected to each other to form a unitary combined layer; and the heat dissipation layers arranged between the green color block layers and the micro light-emitting diodes are connected to each other to form a unitary combined layer.

\* \* \* \* \*